United States Patent [19]

Kuchta

[11] Patent Number: 5,112,721
[45] Date of Patent: May 12, 1992

[54] PHOTOPOLYMERIZABLE COMPOSITIONS CONTAINING SENSITIZER MIXTURES

[75] Inventor: August D. Kuchta, Sayre, Pa.

[73] Assignee: E. I. Du Pont de Nemours and Company, Wilmington, Del.

[21] Appl. No.: 732,721

[22] Filed: Jul. 19, 1991

Related U.S. Application Data

[63] Continuation of Ser. No. 471,307, Jan. 29, 1990, abandoned.

[51] Int. Cl.⁵ ............................................. G03F 7/031
[52] U.S. Cl. ................................... 430/281; 430/926; 430/920; 430/916; 522/26; 522/16; 522/14
[58] Field of Search .............. 430/926, 920, 281, 916; 522/26, 16, 14

[56] References Cited

U.S. PATENT DOCUMENTS

| | | | |
|---|---|---|---|
| 3,652,275 | 3/1972 | Baum et al. | 96/48 |
| 3,854,950 | 12/1974 | Held | 96/84 |
| 4,162,162 | 7/1979 | Dueber | 96/115 |
| 4,268,603 | 5/1981 | Sato | 430/196 |
| 4,917,977 | 4/1990 | Smothers | 430/916 X |

*Primary Examiner*—Cynthia Hamilton

[57] ABSTRACT

Combinations of selected photosensitizers produce unexpected increases in the both the photospeed of, and the resolution obtainable from, photopolymerizable compositions. The combinations contain one photosensitizer, known as the sensitizer, and a second photosensitizer, known as the co-sensitizer. The co-sensitizer has an absorbance maximum at a longer wavelength than the sensitizer and is generally present a much lower concentration than the sensitizer.

27 Claims, No Drawings

PHOTOPOLYMERIZABLE COMPOSITIONS CONTAINING SENSITIZER MIXTURES

This application is a continuation of application Ser. No. 07/471,307 filed Jan. 29, 1990 now abandoned.

FIELD OF THE INVENTION

This invention relates to photopolymerizable compositions that absorb in the visible region of the spectrum. More particularly, this invention pertains to photopolymerizable compositions containing selected photodissociable initiators in combination with mixtures of selected sensitizers and co-sensitizers.

BACKGROUND OF THE INVENTION

Photopolymerizable compositions comprising added dyes are known. Conventionally, the dye may be added for one or several reasons. As described, for example, in Baum and Henry, U.S. Pat. No. 3,652,275, and in Dueber. U.S Pat. No. 4,162,162, the added dye, generally known as a sensitizer, can absorb actinic radiation and activate the photoinitiation process. As described, for example, in Held, U.S. Pat. No. 3,854,950, the added dye, generally known as an antihalation agent, can absorb scattered and reflected actinic radiation an improve the resolution of the resulting photopolymer image. The added dye may also provide color to facilitate visual inspection of the resulting exposed and washed-out photopolymer image.

To be effective, antihalation agents must absorb the scattered and reflected actinic radiation. Therefore, they must absorb the same region of the spectrum as the photoinitiator system, and, thus, will absorb part of the incident actinic radiation as well Consequently, improved resolution is accomplished at a loss in photospeed.

Photopolymerizable compositions containing two added dyes are known. In Sato, U.S. Pat. No. 4,268,603, a photocrosslinkable photoresist system comprising a bis-azide; a photoextinction agent, which has its absorption maximum at a longer wavelength than the bis-azide; and a fluorescent agent, which absorbs at the same wavelength as the bis-azide, but fluoresces at a wavelength which is absorbed by the photoextinction agent, is disclosed. In this composition, the loss of ultraviolet absorption at about 360 nm, the wavelength of the incident actinic radiation, caused by photodecomposition of the bis-azide as the photoreaction proceeds is compensated for by formation of a photodegradation product which absorbs at 360 nm from the photodegradation of the photoextinction agent. Photodegradation of the photoextinction agent is initiated by the radiation emitted by the fluorescent agent. Thus, the optical density of the composition at 360 nm remains essentially constant throughout the exposure, and the amount of light reflected by the support does not increase as reaction proceeds. However, in this system part of the actinic radiation is absorbed by the fluorescent agent.

SUMMARY OF THE INVENTION

It has been discovered that combinations of selected photosensitizers produce unexpected increases in the both the photospeed of, and the resolution obtainable from, photopolymerizable compositions. The combinations contain one photosensitizer, known as the sensitizer, and a second photosensitizer, known as the co-sensitizer. The co-sensitizer has an absorbance maximum at a longer wavelength than the sensitizer and is generally present at a much lower concentration than the sensitizer.

It is the object of this invention to provide a photopolymerizable composition containing an initiator system which simultaneously enhances both photospeed and image resolution. This and other objectives are satisfied by a photopolymerizable composition consisting essentially of:

(1) at least one ethylenically unsaturated monomer capable of free radical initiated addition polymerization;

(2) at least one polymeric binder;

(3) an initiator system, capable of being activated by actinic radiation, said initiator system comprising:

(a) a hexaarylbisimidazole;
(b) a chain transfer agent;
(c) a sensitizer of the following structure:

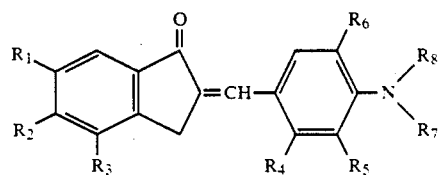

wherein:

$R_1$ and $R_2$ are each independently hydrogen, substituted or unsubstituted alkyl from about 1 to about 6 carbon atoms, or substituted or unsubstituted alkoxyl from about 1 to about 6 carbon atoms, with the proviso that $(R_1+R_2)$ may equal $-OCH_2O-$, or that $R_1$ and $R_2$ may be joined in a carbocyclic substituted or unsubstituted five or six membered ring;

$R_3$ is hydrogen or methyl;

$R_4$ is hydrogen or methyl;

$R_5$ is hydrogen and $R_7$ is alkyl from about 1 to about 6 carbon atoms, with the proviso that $(R_5+R_7)$ may be $-(CH_2)_2-$ or $-(CH_2)_3-$;

$R_6$ is hydrogen and $R_8$ is alkyl from about 1 to about 6 carbon atoms, with the proviso that $(R_6+R_8)$ may be $-(CH_2)_2-$ or $-(CH_2)_3-$, with the further proviso that $(R_5+R_7)$ and $(R_6+R_8)$ may not be $-(CH_2)_2-$ at the same time; and (d) a co-sensitizer, said co-sensitizer having its wavelength of maximum absorption at longer wavelength than that of said sensitizer, and selected from the group consisting of:

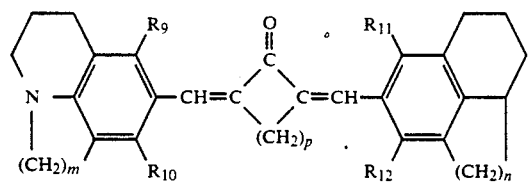

wherein:

m, n, and p are independently 2 or 3; and $R_9$, $R_{10}$, $R_{11}$, and $R_{12}$ are each independently hydrogen, alkyl of from about 1 to about 4 carbon atoms, and alkoxyl for about 1 to about 4 carbon atoms;

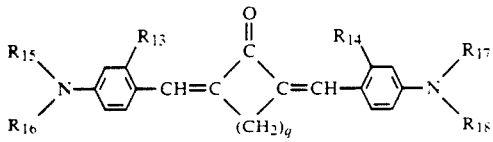

wherein:

q is 2 or 3;

$R_{13}$ and $R_{14}$ are independently hydrogen, methoxy, or alkyl from about 1 to about 4 Carbon atoms;

$R_{15}$, $R_{16}$, $R_{17}$, and $R_{18}$ are each independently alkyl from about 1 to about 4 carbon atoms; and

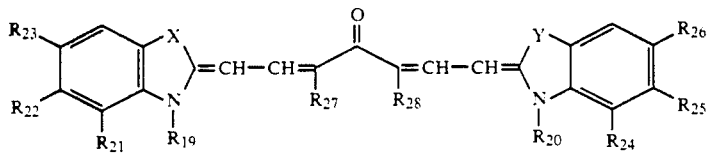

wherein:

$R_{19}$ and $R_{20}$ are each independently alkyl groups of about 1 to about 6 carbon atoms or substituted or unsubstituted phenyl;

$R_{21}$, $R_{22}$, $R_{23}$, $R_{24}$, $R_{25}$, $R_{26}$ are each independently alkyl groups from about 1 to about 6 carbon atoms, alkoxyl groups of about 1 to about 6 carbon atoms, substituted or unsubstituted phenyl, or chlorine, with the proviso that $R_{21}$ and $R_{22}$ together or $R_{22}$ and $R_{23}$ together, and together may joined to form an aliphatic or aromatic ring;

$(R_{27}+R_{28})$ is $-(CHR_{29}CHR_{30})-$ or $-(CH_2CHR_{31}CH_2)-$, where $R_{29}$ and $R_{30}$ are either each hydrogen or joined to form an aromatic ring and $R_{31}$ is either hydrogen or alkyl of from about 1 to about 6 carbon atoms; and X and Y are independently C, S or $CR_{32}R_{33}$, where $R_{32}$ and $R_{33}$ are each independently alkyl from about 1 to about 4 carbon atoms.

In a preferred embodiment of this invention $R_1$ and $R_2$ are each independently hydrogen, substituted or unsubstituted alkyl from about 1 to about 6 carbon atoms, or substituted or unsubstituted alkoxyl from about 1 to about 6 carbon atoms, with the proviso that $(R_1+R_2)$ may equal $-OCH_2O-$, Or that $R_1$ and $R_2$ may be joined in a carbocyclic substituted or unsubstituted five or six membered ring; $R_3$ and $R_4$ are each hydrogen; $(R_5+R_7)$ and $(R_6+R_8)$ are each $-(CH_2)_3-$. The most preferred sensitizer is DMJDI, in which $R_1$ and $R_2$ are each methoxyl. The most preferred co-sensitizer is JAW, in which m and n are 3; p is 2; and $R_9$, $R_{10}$, $R_{11}$, and $R_{12}$ are each hydrogen.

DETAILED DESCRIPTION OF THE INVENTION

The novel compositions of this invention are photopolymerizable compositions in which polymerization is initiated by free radicals generated by actinic radiation. Photopolymerization proceeds by free radical initiated addition polymerization and/or crosslinking of ethylenically unsaturated monomeric compounds. These compositions comprise an initiator system, at least one polymerizable monomer, and at least one binder. These compositions may also comprise other ingredients for a specific use, such as, for example stabilizers, adhesion and coating aids, fillers, and the like.

Initiator System

When activated by actinic radiation, the initiator system furnishes the free-radicals which activate photopolymerization. The initiator system comprises a sensitizer; a co-sensitizer, which is also a sensitizer, but has its absorption maximum at a longer wavelength than the sensitizers; a hexaarylbisimidazole (HABI), and a chain transfer agent.

Sensitizer

The sensitizers of this invention are derivatives of aryl ketones and p-dialkylaminoaldehydes which can be represented by the following general structure:

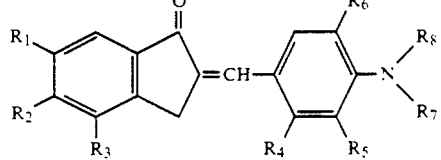

wherein:

$R_1$ and $R_2$ are each independently hydrogen, substituted or unsubstituted alkyl from about 1 to about 6 carbon atoms, or substituted or unsubstituted alkoxyl from about 1 to about 6 carbon atoms, with the proviso that $(R_1+R_2)$ may equal $-OCH_2O-$ or that $R_1$ and $R_2$ may be joined in a carbocyclic substituted or unsubstituted five or six membered ring;

$R_3$ is hydrogen or methyl;

$R_4$ is hydrogen or methyl;

$R_5$ is hydrogen and $R_7$ is alkyl from about 1 to about 6 carbon atoms, with the proviso that $(R_5+R_7)$ may be $-(CH_2)-$ or $-(CH_2)3-$;

$R_6$ is hydrogen and $R_8$ is alkyl from about 1 to about 6 carbon atoms, with the proviso that $(R_6+R_8)$ may be $-(CH_2)_2-$ or $-(CH_2)3-$, with the further proviso that $(R_5+R_7)$ and $(R_6+R_8)$ may not be $-(CH_2)_2-$ at the same time.

These compounds are selected from those disclosed in U.S. Pat. No. 4,162,162, U.S. Pat. No. 4,268,667, and U.S. Pat. No. 4,351,893, the disclosures of which are incorporated herein by reference. A representative sensitizer is DBI, in which $R_1$, $R_2$, $R_3$, $R_5$, and $R_6$ are hydrogen; $R_4$ is methyl; and $R_7$ and $R_8$ are ethyl. DBI has an absorbance maximum at 443 nm (measured in chloroform).

A preferred class of sensitizers are derivatives of 1-indanones and 9-julolidine carboxaldehyde. In this class of sensitizers, $R_1$ and $R_2$ are each independently hydrogen, substituted or unsubstituted alkyl from about 1 to about 6 carbon atoms, or substituted or unsubstituted alkoxyl from about 1 to about 6 carbon atoms, with the proviso that $(R_1+R_2)$ may equal $-OCH_{20}$, or that $R_1$ and $R_2$ may be joined in a carbocyclic substituted or unsubstituted five or six membered ring; $R_3$ and $R_4$ are each hydrogen; $(R_5+R_7)$ and $(R_6+R_8)$ are each $-(CH_2)_3-$.

In the more preferred class of sensitizers, $R_1$ and $R_2$ are each independently hydrogen, substituted or unsubstituted alkyl from about 1 to about 6 carbon atoms, or substituted or unsubstituted alkoxyl from about 1 to about 6 carbon atoms, $R_3$ and $R_4$ are hydrogen; and $(R_5+R_7)$ and $(R_6+R_8)$ are $-(CH_2)_3-$. A representative sensitizer of this class is di-hexyloxy-JDI in which $R_1$ and $R_2$ are each n-hexyloxy. Di-hexyloxy-JDI has an absorbance maximum at 450 nm (ethanol).

The more preferred sensitizers of this class are JDI, in which $R_1$ and $R_2$ are each hydrogen, and DMJDI, in which $R_1$ and $R_2$ are each methoxy. The most preferred sensitizer is DMJDI, i.e., 1H-inden-1-one, 2,3-dihydro-5,6-dimethoxy-2-[(2,3,6,7-tetrahydro-1H,5H-benzo[i,j]— quinolizin-9-yl)methylene]—. The absorption maximum for DMJDI is at 442 nm (dichloromethane). The absorption maximum for JDI is at 452 nm (chloroform).

Co-sensitizers

The co-sensitizers are selected compounds which are also sensitizers of HABI initiated photopolymerization but which have their absorption maximum at longer wavelengths than the sensitizers. While the optimal separation between the absorbance maxima of the sensitizer and the co-sensitizer will vary with the nature of the compounds, the conditions of use, and relative concentrations present, in general, the separation will be between about 30 nm to about 150 nm, preferably about 35 nm to about 100 nm.

One class of co-sensitizers is the bis(p-dialkylamino)-alpha,beta-unsaturated ketones selected from the group represented by the following general structure:

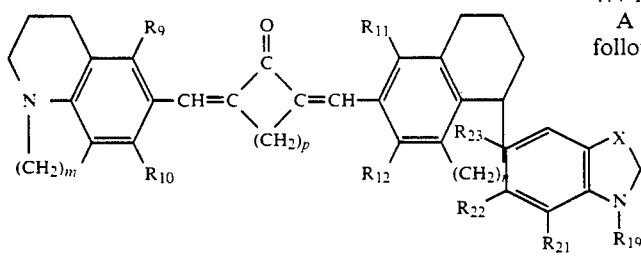

wherein;

m, n, and p are independently 2 or 3; and $R_9$, $R_{10}$, $R_{11}$, and $R_{12}$ are each independently hydrogen, alkyl of from about 1 to about 4 carbon atoms, and alkoxyl for about 1 to about 4 carbon atoms.

These compounds are disclosed in co-assignee's U.S. patent application Ser. No. 07/228,806, filed Jul. 28, 1988. Preferred members of this class are those in which m and n are 3; p is 2; and $R_9$, $R_{10}$, $R_{11}$, and $R_{12}$ are each independently hydrogen, alkyl of from about 1 to about 4 carbon atoms, and alkoxyl for about 1 to about 4 carbon atoms. The most preferred member of this class is JAW, i.e., cyclopentanone, 2,5-bis[(2,3,6,7-tetrahydro-1H,5H-benzo [i,j]quinolizin-9-yl)methylene]—, in which $R_9$, $R_{10}$, $R_{11}$, and $R_{12}$ are each hydrogen. The absorption maximum for JAW is at 496 nm (dichloromethane).

A second class of co-sensitizers is the bis(p-dialkylamino)-alpha,beta-unsaturated ketones represented by the following general structure:

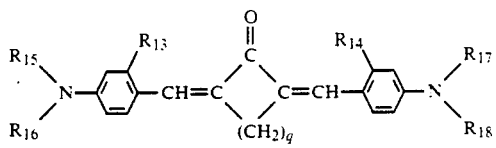

wherein:

q is 2 or 3;

$R_{13}$ and $R_{14}$ are independently hydrogen, methoxy, or alkyl from about 1 to about 4 carbon atoms;

$R_{15}$, $R_{16}$, $R_{17}$, and $R_{18}$ are each independently alkyl from about 1 to about 4 carbon atom.

These compounds are disclosed in U.S. Pat. No. 3,652,275, the disclosure of which is incorporated herein by reference.

The preferred class are symmetrical co-sensitizers in which q is 2; $R_{13}$ and $R_{14}$ are the same and either hydrogen or methyl; and $R_{15}$, $R_{16}$, $R_{17}$, and $R_{18}$ are the same and alkyl from about 1 to about 4 carbon atoms. The most preferred compounds are those in which $R_{15}$, $R_{16}$, $R_{17}$, and $R_{18}$ are the same and are methyl or ethyl. Members of the most preferred class include DBC, i.e., cyclopentanone, 2,5-bis-[4-(diethylamino)-2-methylphenyl]methylene]-, in which $R_{13}$ and $R_{14}$ are methyl and $R_{15}$, $R_{16}$, $R_{17}$, and $R_{18}$ are ethyl; and DEAW, i.e. cyclopentanone, 2,5-bis[4-(diethylamino)phenyl]methylene]-, in which $R_{13}$ and $R_{14}$ are hydrogen and $R_{15}$, $R_{16}$, $R_{17}$, and $R_{18}$ are ethyl. The absorption maxima for these compounds are: DBC, 481 nm; and DEAW, 477 nm (each in dichloromethane).

A third class of co-sensitizers is represented by the following structure:

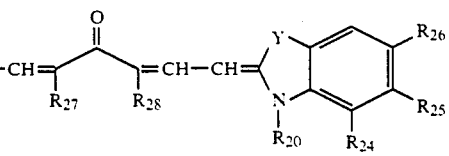

wherein:

$R_{19}$ and $R_{20}$ are each independently alkyl groups of about 1 to about 6 carbon atoms or substituted or unsubstituted phenyl;

$R_{21}$, $R_{22}$, $R_{23}$, $R_{24}$, $R_{25}$, $R_{26}$ are each independently alkyl groups from about 1 to about 6 carbon atoms, alkoxyl groups of about 1 to about 6 carbon atoms, substituted or unsubstituted phenyl, or chlorine, with the proviso that $R_{21}$ and $R_{22}$ together Or $R_{22}$ and $R_{23}$ together, and that $R_{24}$ and $R_{25}$ together or $R_{25}$ and $R_{26}$ together may joined to form an aliphatic or aromatic ring;

$(R_{27}+R_{28})$ is $-(CHR_{29}CHR_{30})-$ or $-(CH_2CHR_{31}CH_2)-$, where $R_{29}$ and $R_{30}$ are either each hydrogen or joined to form an aromatic ring and $R_{31}$ is either hydrogen or alkyl of from about 1 to about 6 carbon atoms; and X and Y are independently O, S or $CR_{32}R_{33}$, where $R_{32}$ and $R_{33}$ are each independently alkyl from about 1 to about 4 carbon atoms.

These compounds are disclosed in consignee's allowed U.S. patent application Ser. No. 07/289,119, filed Dec. 23, 1988, allowed Nov. 14, 1989, the disclosure of which is incorporated herein by reference.

In a preferred class of these co-sensitizers, X and Y are identical and equal to $C(CH_3)_2$; $(R_{27}+R_{28})$ is $-(CH_2)_2-$ or $-(CH_2CHR_{31}CH_2)-$, where $R_{31}$ is H or t-butyl; $R_{19}$ and $R_{20}$ are identical and equal to $CH_3$ or $C_2H_5$; $R_{23}$ and $R_{26}$ are hydrogen; and $R_{21}$ and $R_{22}$ are each either hydrogen or joined to form an aromatic ring and $R_{24}$ and $R_{25}$ are each either hydrogen or joined to form an aromatic ring. In the more preferred co-sensitizers $(R_{27}+R_{28})$ is $-(CH_2)_2-$ or $-(CH_2CHR_{31}CH_2)-$, where $R_{31}$ is H or t-butyl; $R_{19}$ and $R_{20}$ are identical and equal to $CH_3$ or $C_2H_5$; $R_{21}$, $R_{22}$, $R_{24}$, and $R_{25}$ are each hydrogen. FAW, FACH, and FACBH, which are described in Example 3, are representative members of this class.

Hexaarylbisimidazoles

The sensitizers and co-sensitizers are used in conjunction with 2,4,5-triphenylimidazolyl dimers, also known as the 2,2', 4,4', 5,5'-hexaarylbisimidazoles or HABI's, and mixtures thereof. These compounds dissociate on exposure to actinic radiation to form the corresponding triarylimidazolyl free radicals. These hexaarylbisimidazoles absorb maximally in the 255-275 nm region of the spectrum, and usually show some, though lesser absorption in the 300-375 nm region. Although the absorption bands tend to tail out to include wavelengths as high as 430 nm, in the absence of a sensitizer these compounds normally require light rich in the 255-375 nm region of the spectrum for their dissociation.

HABI's and use of HABI-initiated photopolymerizable systems have been previously disclosed in: Chambers, U.S. Pat. No. 3,479,185; Chang et al., U.S. Pat. No. 3,549,367; Cescon, U.S. Pat. No. 3,784,557; Dessauer, U.S Pat. No. 4,252,887; Chambers et al., U.S. Pat. No. 4,264,708; Wada, et al., U.S. Pat. No. 4,410,621; and Tanaka et al., U.S. Pat. No. 4,459,349.

Preferred HABI's are 2-O-chlorosubstituted hexaphenylbisimidazoles in which the other positions on the phenyl radicals are unsubstituted or substituted with chloro, methyl or methoxy. The most preferred initiators include CDM-HABI, i.e., 2-(o-chlorophenyl)-4,5-bis(m-methoxyphenyl)-imidazole dimer; o-Cl-HABI, i.e., 1,1'-biimidazole, 2,2'-bis (o-chlorophenyl)4,4,', 5,5'-tetraphenyl-; and TCTM-HABI, i.e., 1H-imidazole, 2,5-bis(o-chlorophenyl)-4-[3,4-dimethoxyphenyl]—, dimer.

Chain Transfer Agents

Conventional chain transfer agents, or hydrogen donors, are used with HABI-initiated photopolymerizable systems. Suitable chain transfer agents include organic thiols, such as 2-mercaptobenzothiazole, 2-mercaptobenzoxazole, and 2-mercaptobenzimidazole. Others which can be used include various tertiary amines known in the art, N-phenylglycine, and 1,1-dimethyl-3,5-diketocyclohexane. Except for systems which contain N-vinyl carbazole monomer, the preferred chain transfer agents are N-phenylglycine, 2-mercaptobenzoxazole, and 2-mercaptobenzthiazole. For photopolymerizable compositions which contain the monomer N-vinyl carbazole, the most preferred chain transfer agents is: 4-methyl-4H-1,2,4-triazole-3-thiol.

Monomer

The composition contains at least one ethylenically unsaturated compound which undergoes free-radical initiated polymerization, generally known as a monomer The composition contains at least one such material and may contain a mixture of such materials. Typical monomers are: unsaturated esters of alcohols, preferably polyols, such as, diethylene glycol diacrylate, glycerol triacrylate, ethylene glycol dimethacrylate, pentaerythritol tri- and tetraacrylate and methacrylate; unsaturated amides, such 1,6-hexamethylene bis-acrylamide; vinyl esters such as divinyl succinate, divinyl phthalate, and divinyl benzene-1,3-disulfonate; styrene and derivatives thereof; and N-vinyl compounds, such as N-vinyl carbazole. Numerous other unsaturated monomers polymerizable by free-radical initiated polymerization and useful in photopolymerizable compositions are known to those skilled in the art. For photoresist applications the preferred monomers are trimethylol propane triacrylate, the triacrylate ester of ethoxylated trimethylolpropane, tetraethylene glycol diacrylate, and tetraethylene glycol dimethacrylate.

Binder

The composition contains at least one preformed macromolecular polymeric or resin material, generally know as a binder. The composition contains at least one such material and may contain a mixture of such materials. In general, the binder should be soluble or swellable in the coating solvent and compatible with the other components of the photopolymerizable system. Representative binders are poly(methyl methacrylate) and copolymers of methyl methacrylate with other alkyl acrylates, alkyl methacrylates, methacrylic acid, and/or acrylic acid; poly(vinyl acetate) and its partially hydrolyzed derivatives; gelatin; cellulose esters and ethers, such as cellulose acetate butyrate; and polyethylene oxides. Numerous other binders useful in photopolymerizable compositions are known to those skilled in the art. For photoresist applications the preferred binders are copolymers of methyl methacrylate, ethyl acrylate, and methacrylic acid as well as half esters, preferably the iso-butyl half ester, of styrene/maleic anhydride copolymers. Copolymers of methyl methacrylate, ethyl acrylate, and methacrylic acid copolymerized with a small amount of allyl methacrylate may also be used to advantage.

Other Components

Other components conventionally added to photopolymerizable compositions can be present to modify the physical properties of the film. Such components include: plasticizers, thermal stabilizers, optical brighteners, ultraviolet radiation absorbing material, adhesion modifiers, coating aids, and release agents.

A plasticizer may be present to modify adhesion, flexibility, hardness, and other mechanical properties of the film in a conventional fashion. When a binder is present, a plasticizer would be selected which is compatible with the binder as well as the ethylenically unsaturated monomer and other components of the composition. With acrylic binders, for example, plasticizers can include dibutyl phthalate and other esters of aromatic acids; esters of aliphatic polyacids, such as diisooctyl adipate; aromatic or aliphatic acid esters of glycols, polyoxyalkylene glycols, aliphatic polyols; alkyl and aryl phosphates; and chlorinated paraffins. In general, water insoluble plasticizers are preferred for greater high humidity storage stability, but are not necessary to get improved latitude.

Many ethylenically unsaturated monomers are subject to thermal polymerization, especially when stored for long periods or at elevated temperatures. Normally a conventional thermal polymerization inhibitor will be present to improve the storage stability the photopolymerizable composition. The nitroso dimers described in Pazos, U.S. Pat. No. 4,168,982, are also useful. Since monomers generally contain thermal polymerization inhibitors added by their manufacturers, it is frequently unnecessary to add additional inhibitor.

Nonionic surfactants may be added to the photopolymerizable composition as coating aids. Typical coating aids are polyethylene oxides, such as Polyox® WSRN, and fluorinated nonionic surfactants, such as Fluorad® FC-430 and Fluorad® FC-431.

Depending on the application, other inert additives can be employed such as dyes, pigments and fillers. These additives are generally present in minor amounts so as not to interfere with the exposure of the photopolymerizable layer.

Composition

While the composition of the photopolymerizable composition will depend on the intended application, when the composition is to be used as a dry film, in general, the binder should be at least about 25% and the monomer should not exceed about 60%, based on the total weight of the composition. If the amount of binder is below approximately 25%, or the amount of monomer exceeds approximately 60%, the composition has insufficient viscosity to form a solid film. While the amount of initiator system present will depend on the thickness of the layer and the desired optical density for the intended application, in general, about 0.1% to about 10% will be present.

Typical compositions are: binder(s) 25 to 90%, preferably 45 to 75%; monomer(s), 5 to 60%, preferably, 15 to 50%; plasticizer, 0 to 25%, preferably, 0 to 15%; photoinitiator system, 0.1 to 10%, preferably 1 to 7%; and other ingredients, 0 to 5%, typically 0 to 4%. While the amount of sensitizer and co-sensitizer present will depend on the intended application, the thickness of the photopolymerizable layer, the wavelength(s) of actinic radiation used for activation, and the absorption spectra of the particular compounds selected, typically the composition will contain 0.02% to 1.0%, preferably 0.05% to 0.5% sensitizer; and 0.005% to 0.3%, preferably, 0.01% to 0.2% co-sensitizer. The concentration of the co-sensitizer should be less than, or equal to, that of the sensitizer. In general, the sensitizer/co-sensitizer concentration ratio, measured by the weight of the materials present, will be in the range of about 1:1 to about 20:1, preferably about 4:1 to about 10:1.

Substrates/Coating

The photopolymerizable compositions can be coated onto a wide variety of substrates. By "substrate" is meant any natural or synthetic support, preferable one which is capable of existing in a flexible or rigid form. For example, the substrate can be a metal sheet or foil, a sheet or film of synthetic organic resin, cellulose paper, fiberboard, and the like, or a composite of two or more of these materials.

The particular substrate will generally be determined by the intended application. For example, when printed circuits are produced, the substrate may be a plate which is a copper coating on fiberboard; in the preparation of of lithographic printing plates, the substrate may be anodized aluminum. Specific substrates include alumina-blasted aluminum, anodized aluminum, alumina-blasted polyethylene terephthalate film, polyethylene terephthalate film, e.g., resin-subbed polyethylene terephthalate film, polyvinyl alcohol-coated paper, cross-linked polyester-coated paper, nylon, glass, cellulose acetate film, heavy paper such as lithographic paper, and the like.

The photopolymerizable layer may prepared by mixing the ingredients of the photopolymerizable composition in a solvent, such as dichloromethane, usually in the weight ratio of about 15:85 to 25:75 (solids to solvent), coating on the substrate, and evaporating the solvent. Coatings should be uniform. While the thickness of the layer will depend on the intended application, for dry film photoresists the coating should should have a thickness of about 0.2 to 4 mil (5 to 100 microns), preferably 0.5 to 2 mil (13 to 50 microns), when dry. For protection, a release film, such as polyethylene or polypropylene, may be placed over the photopolymerizable layer after the solvent evaporates.

Alternatively, since polymer films are quickly and efficiently coated using continuous web coating techniques, it may be convenient to coat the photopolymerizable composition onto a polymer film support, such as polyethylene terephthalate film support, sand laminate the resulting photopolymerizable layer to the substrate prior to exposure. The photopolymerizable layer may be protected until it is ready for use by, preferably, a release film, such as polyethylene or polypropylene, applied as the coated polymer film emerges from the drier. After removal of the release film, the photopolymerizable layer can then be laminated to the support. The polymer film support then acts as a coversheet which is removed after exposure.

EXPOSURE/IMAGE FORMATION

Any convenient source or sources of actinic radiation providing wavelengths in the region of the spectrum that overlap the absorption bands of the sensitizer can be used to activate photopolymerization. By "actinic radiation" is meant radiation which is active to produce the free-radicals necessary to initiate polymerization of the monomer(s). The radiation can be natural or artificial, monochromatic or polychromatic, incoherent or coherent, and for high efficiency should correspond closely to in wavelength to the absorption of the initiator system. Conventional light sources include fluorescent lamps, mercury, metal additive and arc lamps. Coherent light sources are xenon, argon ion, and ionized neon laser, as well as tunable dye lasers and the frequency doubled neodymium:YAG laser, whose emissions fall within or overlap the visible absorption bands of the sensitizer.

Industrial Applicability

The photopolymerizable compositions of this invention contain an initiator system which simultaneously enhances both the photospeed of the composition and the resolution of the resulting image and will be useful for any application in which simultaneous enhancement of both properties is desirable. They are particularly useful in dry film photoresists and in solder masks.

In photoresist applications, thin film resists prepared from the photopolymerizable compositions of this invention are useful for the preparation of microcircuits. The resist can be either solvent soluble or aqueous developable. Solder masks are protective coatings which are selectively applied to portions of a printed circuit board to confine solder to pad areas on the board and to prevent bridging between conductors during tinning operations and during soldering of components. A solder mask also functions to Prevent or minimize corrosion of the base copper conductors and as a dielectric to insulate certain components in adjacent circuitry.

The advantageous properties of this invention can be observed by reference to the following examples which illustrate, but do not limit, the invention.

EXAMPLES

| GLOSSARY | |
|---|---|
| o-Cl-HABI | 1,1'-Biimidazole, 2,2'-bis[o-chlorophenyl]-4,4',5,5'-tetraphenyl-; CAS 1707-68-2 |
| DEAW | Cyclopentanone, 2,5-bis[4-(diethylamino)phenyl]methylene]-; CAS 38394-53-5 |
| DMJDI | 1H-Inden-1-one, 2,3-dihydro-5,6-dimethoxy-2-[(2,3,6,7-tetrahydro-1H,5H-benzo[i,j]-quinolizin-9-yl)methylene]-; CAS 80867-05-6 |
| FAW | Cyclopentanone, 2,5-bis[2-(1,3-dihydro-1,3,3-trimethyl-2H-indol-2-ylidene)ethylidene]-; CAS 27713-85-5 |
| FACH | Cyclohexanone, 2,6-bis[2-(1,3-dihydro-1,3,3-trimethyl-2H-indol-2-ylidene)ethylidene-; CAS 53115-04-1 |
| FABCH | Cyclohexanone, 2,6-bis[2-(1,3-dihydro-1,3,3-trimethyl-2H-indol-2-ylidene)ethylidene-5-(1,1-dimethyethyl)- |
| 9-JA | 9-Julolidine carboxaldehyde; 9-Carboxaldehyde, 2,3,6,7-tetrahydro-1H,5H-benzo[i,j]quinolizine; CAS 33985-71-6 |
| JAW | Cyclopentanone, 2,5-bis[(2,3,6,7-tetrahydro-1H,5H-benzo[i,j]quinolizin-9-yl)methylene]- |
| Polyox ® WSRN 3000 | Polyethylene oxide, MW 400,000; Union Carbide, Danbury, CT |
| TAOBN | 1,4,4-Trimethyl-2,3-diazobicyclo(3.2.2)-non-2-ene-2,3-dioxide |
| TMPEOTA | Triacrylate ester of ethoxylated trimethylolpropane; CAS 28961-43-5 |
| TMPTA | Trimethylolpropane triacrylate; 2-ethyl-2-(hydroxymethyl)-1,3-propanediol triacrylate; CAS 15625-89-5 |

In the examples which follow it should be understood that "coating solution" refers to the mixture of solvent and additives which is coated, even though some of the additives may be in suspension rather than in solution, and that "total solids" refers to the total amount of nonvolatile material in the coating solution even through some of the additives may be nonvolatile liquids at ambient temperature.

A copy of representative compounds and their structures is provided on the following page.

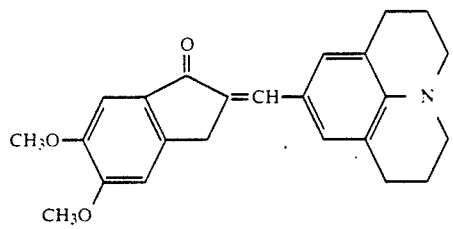

DMJDI

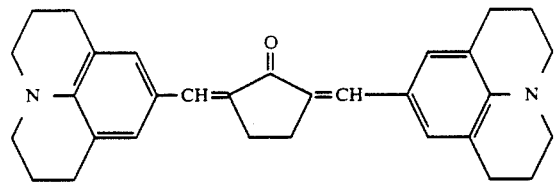

JAW

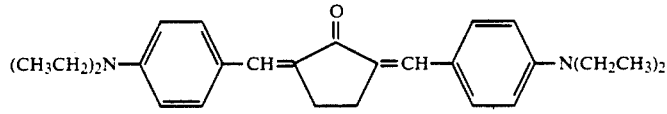

DEAW

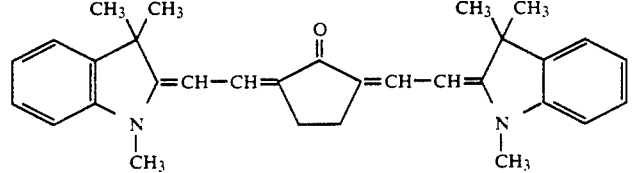

FAW

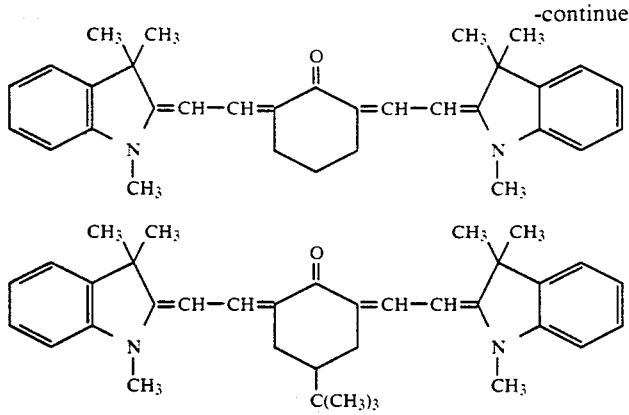

Example 1

This example illustrates the synthesis of binder A.

An emulsion polymerization apparatus consisting of a 5 L. 4 necked flask equipped with a mechanical stirrer, a 1 L addition funnel, thermometer, nitrogen inlet, water cooled reflux condenser and a heating mantle is charged with 3,360 g of deionized water and 20 g of a 30% aqueous solution of sodium lauryl sulfonate and heated to 80° C. under a nitrogen atmosphere. At that temperature 25% of a mixture of 420 g of methyl methacrylate, 240 g ethyl acrylate, 165 g methacrylic acid, and 16 allyl methacrylate is added in one shot, immediately followed by 10 mL of 5% aqueous potassium persulfate and 10 mL of 7% aqueous potassium phosphate. The remainder of the monomer mixture is added over a period of 90 min while the temperature is maintained at 80-88° C. Then the reaction is heated at 80-85° C. for an additional 2 hr. The reaction mixture is cooled to room temperature and the product coagulated with methanol. The resulting slurry is filtered, washed twice with water and sucked dry. The resulting fine powder is dried in an oven at 100° C. for 4 hr.

Example 2

This example illustrates the synthesis of JAW, a co-sensitizer of this invention.

JAW was synthesized by the base catalyzed condensation of 9-JA with cyclopentanone. In 225 mL of methanol was dissolved 11.4 g (0.135 M) of cyclopentanone, 55.0 g (0.273 M) of 9-JA, and 2.8 g (0.07 M) of sodium methoxide. The reaction mixture, heated at reflux, quickly turned dark red and red solid began to separate. After 7.5 hr of heating at reflux, the reaction mixture was allowed to cool to room temperature. After standing for about 40 hr, the reaction mixture was cooled in an ice bath. The resulting red precipitate was filtered off and washed with cold methanol. Yield: 55.0 g (89%) of red crystals mp 268-278° C. with decomposition. λmax(dichloromethane) 496 nm (ε62,000).

Example 3

This example illustrates the synthesis of FAW, FACH, and FABCH, co-sensitizers of this invention.

The co-sensitizers were prepared by Claisen-Schmidt condensation in tert-butyl alcohol using potassium tert-butoxide, two equivalents of aromatic aldehyde, and one equivalent of the appropriate ketone. Ketones used include: cyclopentanone (FAW), cyclohexanone (FACH), and 4-tert-butylcyclohexanone (FABCH). Sensitizer structure was verified by proton nuclear magnetic resonance spectroscopy. The general synthetic procedure is exemplified with the preparation of sensitizer FAW. The melting points and absorption maxima are listed in Table 1.

Synthesis of FAW A 1.0 liter three-neck round-bottom flask fitted with a reflux condenser, mechanical stirrer and nitrogen purge was charged with 500 mL of tert-butyl alcohol and 37 g of potassium tert-butoxide (0.33 mol). The mixture was stirred for approximately 30 min to dissolve the potassium tert-butoxide. Fisher's aldehyde [(1,3-dihydro-1,3,3-trimethyl-2H-indol-2-ylidene) acetaldehyde; CAS 84-83-3](60 g, 0.3 mol) was added, the reaction mixture was heated to reflux, and cyclopentanone (12.5 g, 0.15 mol) was added slowly over 80-90 min. After refluxing 12-14 hr, 100 mL of water was added and the reaction mixture cooled to room temperature. The solid product collected by filtration, washed with cold methanol, and dried under vacuum to yield 47.6 g (71%) of dark maroon crystals. mp 262-263° C.

TABLE 1

| Co-sensitizer | Melting Point (°C.) | λ max[b] (nm) | ε max[b] |
|---|---|---|---|
| FAW | 262-263[a] | 520 | 103,000 |
| FACH | 269-271 | 503 | 85,500 |
| FABCH | 280-283 | 502 | 78,700 |

[a]literature: 265-266° C. (Brooker et al. U.S. Pat. No. 3,672,906)
[b]in dichloromethane.

Example 4

This example demonstrates that an unexpected increase in both photospeed and resolution was observed in a photoresist system containing a mixture cf DMJDI and JAW.

The stock coating solution shown in Table 2 was prepared at about 35% total solids in 95:5 dichloromethane/methanol.

TABLE 2

| Component | Percent by Weight |
|---|---|
| Polyox ® WSRN-3000 | 0.42 |
| TMPTA | 6.0 |
| TMPEOTA | 21.0 |
| Poly(methyl methacrylate/ethyl acrylate/methacrylic acid)(51/29/20). Wt. Ave. M.W. 40,000-47,000, Tg 80° C., Acid No. 131 | 47.4 |
| Binder A[a] | 12.0 |
| Benzophenone | 8.0 |
| o-Cl-HABI | 4.0 |
| Leuco Crystal Violet | 0.30 |

TABLE 2-continued

| Component | Percent by Weight |
|---|---|
| N-Phenyl glycine | 0.74 |

*See Example 1 for synthesis.

The stock coating solution was divided into portions and sensitizer and co-sensitizer added as indicated in Table 3. The resulting coating solutions indicated in Table 3. The resulting coating solutions were board coated with a doctor knife and air dried to give coatings about 1.5 mil (38 microns) thick.

Each coating was laminated to a copper clad circuit board substrate which was scrubbed with an abrasive brush, using a Riston ® hot roll laminator at about b 210° F. (99° C.) at a speed of 5 ft/min (152 cm/min). Each laminated layer was imagewise exposed under vacuum to radiation having wavelengths greater than about 460 nm using the filtered output of a Riston ® PC Printer. In this exposure procedure, a forty one step Stouffer sixth root of two Resolution Chart and a 1 mil (25 micron) thick sheet of Kapton ® polyimide film was placed over the polyethylene terephthalate support of the laminated layer in the vacuum frame of the PC Printer and irradiated to give exposures at the polyimide film surface indicated in the following table. The polyimide sheet is substantially opaque to radiation having wavelengths less than 460 nm, i.e., the sheet has an optical density of 1.6 at 460 nm, an optical density of 2 at 450 nm and higher optical densities at shorter wavelengths.

After exposure, the unexposed portions of the photopolymer layer were washed out with 1% by weight aqueous solution of sodium carbonate monohydrate at 85° F. (29° C.) using a Chemcut ® 547 processing system at a transport rate of about 73 in/min (185 cm/min).

The uncovered copper laminate surface, protected by the developed photoresist, was then conventionally electroplated: first with about 0.9 mil (23 micron) of copper, then with about 0.5 mil (13 micron) of nickel and finally with about 0.1 mil (2.5 micron) of gold. Copper and nickel plating were carried out at a current density of 30 amp/ft2 using a conventional acidic hi thro copper solution and an acidic nickel sulfamate solution respectively. Gold plating was carried out at a current density of 10 amp/ft2 using an Orosene ®999 plating bath.

The photopolymerized resist was then conventionally striped from the plated laminate using 1.5% KOH at 130° F. (54° C.) in an ASI Stripping Unit. The uncovered copper, not protected by gold plating, was etched away to form a gold plated conductive line negative image of the original target phototool. Speed (number of sixth root of 2 steps held) and resolution (width of the narrowest line held are given in Table 3. Resolution was measured (1) after etching and stripping, but before plating, and (2) after plating. Resolution comparisons should be made between samples which have the same degree of polymerization, that is, exposures which gave the same number of steps.

TABLE 3

| SENSITIZER | EXPOSURE$^a$ | PHOTOSPEED$^b$ | RESOLUTION$^c$ Etching | RESOLUTION$^c$ Plating |
|---|---|---|---|---|
| 0.28% DMJDI | 30 | 16 | 1.9 | 2.9 |
| 0.28% DMJDI | 60 | 22 | 2.4 | 6.0 |
| 0.05% JAW | 30 | 18 | 1.8 | 2.0 |
| 0.05% JAW | 60 | 24 | 2.8 | 4.2 |
| 0.28% DMJDI + 0.05% JAW | 30 | 22 | 2.2 | 3.0 |
| 0.28% DMJDI + 0.05% JAW | 60 | 28 | 4.2 | 5.8 |

$^a$mJ/cm$^2$
$^b$Sixth root of two steps
$^c$Width of finest lines held in mils.

Example 5

This example demonstrates that an unexpected increase in both photospeed and resolution was observed with a mixture of DMJDI and various co-sensitizers.

The stock coating solution shown in Table ∝ was prepared at about 34% total solids in 92.5:715 dichloromethane/methanol.

TABLE 4

| Component | Percent by Weight |
|---|---|
| Polyox ® WSRN-3000 | 0.41 |
| TMPTA | 6.0 |
| TMPEOTA | 20.9 |
| Poly(methyl methacrylate/ethyl acrylate/methacrylic acid)(51/29/20), Wt. Ave. M.W. 40,000–47,000, Tg 80° C., Acid No. 131 | 47.0 |
| Binder A$^a$ | 12.0 |
| Benzophenone | 8.0 |
| o-Cl-HABI | 4.0 |
| Leuco Crystal Violet | 0.30 |
| N-Phenyl glycine | 0.75 |
| TAOBN | 0.006 |

$^a$See Example 1 for synthesis.

The procedure of Example 4 was repeated with several different co-sensitizers except that the copper clad circuit boards containing developed photoresist were examined following exposure and wash out. The boards were not additionally plated and stripped as in Example 4. Photospeed and resolution for these compositions are given in Table 5.

TABLE 5

| SENSITIZER | EXPOSURE$^a$ | PHOTOSPEED$^b$ | RESOLUTION$^a$ |
|---|---|---|---|
| 0.28% DMJDI | 93 | 20 | 2.9 |
| 0.28% DMJDI | 140 | 25 | 4.9 |
| 0.28% DMJDI + 0.03% DEAW | 60 | 20 | 2.5 |
| 0.28% DMJDI + 0.03% DEAW | 100 | 25 | 3.7 |
| 0.28% DMJDI + 0.03% FABCH | 27 | 20 | 1.5 |
| 0.28% DMJDI + 0.03% FABCH | 50 | 25 | 3.0 |
| 0.28% DMJDI + 0.03% FACH | 30 | 20 | 2.4 |
| 0.28% DMJDI + 0.03% FACH | 67 | 25 | 3.2 |
| 0.28% DMJDI + 0.03% FAW | 40 | 20 | 2.6 |
| 0.28% DMJDI + 0.03% FAW | 80 | 25 | 3.5 |

$^a$mJ/cm$^2$
$^b$Sixth root of two steps.
$^c$Smallest line/spacing dimension resolved following washout. All readings were made at the same step of the step wedge.

Example 6

The procedure of Example 5 was repeated with DMJDI, DMJDI plus DEAW, and DMJDI plus JAW. The results are given in Table 6.

17

TABLE 6

| SENSITIZER | EXPO-SURE[a] | PHOTO-SPEED[b] | RESOLU-TION[c] |
|---|---|---|---|
| 0.28% DMJDI | 60 | 20 | 2.5 |
| 0.28% DMJDI + 0.03% DEAW | 60 | 20 | 1.5 |
| 0.28% DMJDI + 0.03% JAW | 50 | 20 | 1.8 |

[a] mJ/cm$^2$
[b] Sixth root of two steps
[c] Smallest line/spacing dimension resolved following washout. All readings were made at the same step of the step wedge.

Example 7

This example shows illustrates that addition of JAW, a co-sensitizer of this invention produces an unexpected improvement in resolution.

The composition given in Table 7 was prepared. Photoresist films containing (1) 0.23% DMJDI and (2) 0.23% DMJDI plus 0.23% JAW were prepared and evaluated as described in Example 4 except that the samples were not etched and plated. Exposure, carried out with visible laser radiation (488 nm and 514 nm), was made to produce samples with 15 steps each. For the film containing DMJDI, the best resolution was 5 mil lines/spaces. For the sample containing DMJDI and JAW, the best resolution was 4 mil lines/spaces.

TABLE 7

| Component | Percent by Weight |
|---|---|
| Polyox ® WSRN-3000 | 0.43 |
| TMPTA | 6.0 |
| TMPEOTA | 21.0 |
| Poly(methyl methacrylate/ethyl acrylate/methacrylic acid)(51/29/20). Wt. Ave. M.W. 40,000–47,000, Tg 80° C., Acid No. 131 | 59.5 |
| Benzophenone | 8.0 |
| o-Cl-HABI | 4.0 |
| Leuco Crystal Violet | 0.30 |
| N-Phenyl glycine | 0.74 |

Example 8

This example illustrates that unexpected improvement is speed and resolution was observed when exposure was carried out in a projection system.

Samples containing (1) 0.28% DMJDI, and (2) 0.28% DMJDI plus 0.03% JAW were prepared as described in Example 6. These samples were exposed through a 4 in ×4 in (10.2 cm×10.2 cm) laser written liquid crystal photomask. Light from a mercury arc was projected through the mask onto the exposure plane so that there was a six fold enlargement for the image in the exposure plane. Only the 436 nm line of the mercury arc was transmitted by this system.

Significant improvement were seen for the film containing added JAW. These improvements were: (1) improved ability to reproduce aerial images at lower exposure dose; (2) smaller line width change vs. exposure dose; and (3) straighter line edges.

Having described the invention, we now claim the following and their equivalents.

What is claimed is:

1. A photopolymerizable composition consisting essentially of:

(1) at least one ethylenically unsaturated monomer capable of free radical initiated addition polymerization;

(2) at least one polymeric binder;

(3) an initiator system, capable of being activated by actinic radiation, said initiator system comprising:

(a) a hexaarylbisimidazole;

(b) a chain transfer agent;

(c) a sensitizer of the following structure:

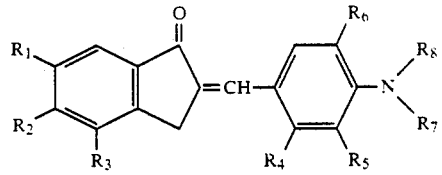

wherein:

$R_1$ and $R_2$ are each independently hydrogen, substituted or unsubstituted alkyl from 1 to 6 carbon atoms, or substituted or unsubstituted alkoxyl from about 1 to 6 carbon atoms, or $R_1$ and $R_2$ together equal —$CHC_2O$— or are joined to form a carbocyclic substituted or unsubstituted five or six membered ring;

$R_3$ is hydrogen or methyl;

$R_4$ is hydrogen or methyl;

$R_5$ is hydrogen and $R_7$ is alkyl from about 1 to about 6 carbon atoms, or $R_5$ and $R_7$ together are —$(CH_2)_2$— or —$(CH_2)_3$—;

$R_6$ is hydrogen and $R_8$ is alkyl from about 1 to about 6 carbon atoms, or $R_6$ and $R_8$ together are —$(CH_2)_2$— or —$(CH_2)_3$—;

$R_6$ is hydrogen and $R_8$ is alkyl from about 1 to about 6 carbon atoms, or $R_6$ and $R_8$ together are —$(CH_2)_2$— or —$(CH_2)_3$—, provided the combination of $R_5$ and $R_7$ and the combination of $R_6$ and $R_8$ cannot be —$(CH_2)_2$— at the same time; and (d) a co-sensitizer, said co-sensitizer having its wavelength of maximum absorption at longer wavelength than that of said sensitizer, and selected from the group consisting of:

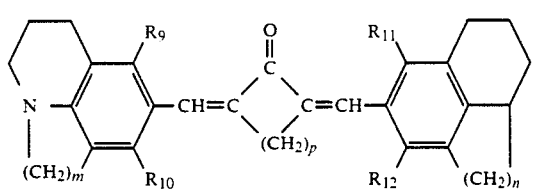

wherein:

m, n, and p are independently 2 or 3; and $R_9$, $R_{10}$, $R_{11}$, and $R_{12}$ are each independently hydrogen, alkyl of from 1 to 4 carbon atoms, and alkoxyl for 1 to 4 carbon atoms;

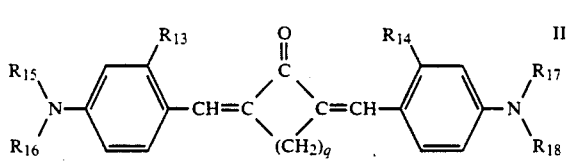

wherein:

q is 2 or 3

$R_{13}$ and $R_{14}$ are independently hydrogen, methoxy, or alkyl from 1 to 4 carbon atoms;

$R_{15}$, $R_{16}$, $R_{17}$, and $R_{18}$ are each independently alkyl from 1 to 4 carbon atoms; and

[Structural formulas at top showing structure with R23, R22, R21, R19, X, CH=CH-C(=O)-... R27, R28 and structure III with Y, R26, R25, R24, R20, =CH-CH=]

wherein:

R$_{19}$ and R$_{20}$ are each independently alkyl of 1 to 6 carbon atoms or substituted or unsubstituted phenyl;

R$_{21}$, R$_{22}$, R$_{23}$, R$_{24}$, R$_{25}$, R$_{26}$ are each independently alkyl from 1 to 6 carbon atoms, alkoxyl of 1 to 6 carbon atoms, substituted or unsubstituted phenyl, or chlorine, or R$_{21}$ and R$_{22}$ together or R$_{22}$ and R$_{23}$ together, and R$_{24}$ and R$_{25}$ together or R$_{25}$ and R$_{26}$ together form an aliphatic or aromatic ring;

or R$_{27}$ and R$_{28}$ together are —(CHR$_{29}$CHR$_{30}$)— or —(CH$_2$CHR$_{31}$CH2)—, where R$_{29}$ and R$_{30}$ are hydrogen or together are joined to form an aromatic ring and R$_{31}$ is hydrogen or alkyl of from 1 to 6 carbon atoms; and X and Y are independently O, S or CR$_{32}$R$_{33}$, where R$_{32}$ and R$_{33}$ are each independently alkyl from 1 to 4 carbon atoms.

2. The composition of claim 1 wherein said composition contains 0.02% to 1.0% by weight of said sensitizer and 0.005% to 0.3% of said co-sensitizer.

3. The composition of claim 2 wherein said composition is a photoresist.

4. The composition of claim 1 wherein R$_3$ and R$_4$ are each hydrogen, and (R$_5$+R$_7$) and (R$_6$+R$_8$) are each —(CH$_2$)$_3$—.

5. The composition of claim 4 wherein R$_1$ and R$_2$ are each hydrogen or alkoxy from 1 to 6 carbon atoms.

6. The composition of claim 5 wherein the co-sensitizer has structure I and p is 2; m and n are 3; and R$_9$, R$_{10}$, R$_{11}$, and R$_{12}$ are each hydrogen.

7. The composition of claim 6 wherein said composition contains 0.05% to 0.5% by weight of said sensitizer and 0.01% to 0.2% of said co-sensitizer.

8. The composition of claim 7 wherein said composition is a photoresist.

9. The composition of claim 5 wherein R$_1$ and R$_2$ are each methoxyl.

10. The composition of claim 6 wherein the co-sensitizer has structure I and p is 2; m and n are 3; and R$_9$, R$_{10}$, R$_{11}$, and R$_{12}$ are each hydrogen.

11. The composition of claim 10 wherein said composition contains 0.05% to 0.5% by weight of said sensitizer and 0.01% to 0.2% of said co-sensitizer.

12. The composition of claim 1 wherein the co-sensitizer has Structure I.

13. The composition of claim 12 wherein m and n are 3; p is 2; and R$_9$, R$_{10}$, R$_{11}$, and R$_{12}$ are each independently hydrogen, alkyl of from 1 to 4 carbon atoms, and alkoxyl for 1 to 4 carbon atoms.

14. The composition of claim 13 wherein R$_9$, R$_{10}$, R$_{11}$, and R$_{12}$ are each hydrogen.

15. The composition of claim 1 wherein the co-sensitizer has Structure II.

16. The composition of claim 15 wherein q is 2; R$_{13}$ and R$_{14}$ are the same and either hydrogen or methyl; and R$_{15}$, R$_{16}$, R$_{17}$, and R$_{18}$ are the same and alkyl from about 1 to about 4 carbon atoms.

17. The composition of claim 16 wherein R$_{15}$, R$_{16}$, R$_{17}$, and R$_{18}$ are the same and are methyl or ethyl.

18. The composition of claim 17 wherein R$_3$ and R$_4$ are each hydrogen, (R$_5$+R$_7$) and (R$_6$+R$_8$) are each —(CH$_2$)$_3$—; and R$_1$ and R$_2$ are each hydrogen or alkoxy from about 1 to about 6 carbon atoms.

19. The composition of claim 18 wherein said composition contains 0.05% to 0.5% by weight of said sensitizer and 0.01% to 0.2% of said co-sensitizer.

20. The composition of claim 1 wherein the co-sensitizer has Structure III.

21. The composition of claim 20 wherein X and Y are identical and equal to C(CH$_3$)$_2$; (R$_{27}$+R$_{28}$) is —(CH$_2$)$_2$— or —(CH$_2$CHR$_3$;CH$_2$)—, where R$_{31}$ is H or t-butyl; R$_{19}$ and R$_{20}$ are identical and equal to CH$_3$ or C$_2$H$_5$; R$_{23}$ and R$_{26}$ are hydrogen; and R$_{21}$ and R$_{22}$ are each either hydrogen or joined to form an aromatic ring and R$_{24}$ and R$_{25}$ are each either hydrogen or joined to form an aromatic ring.

22. The composition of claim 21 wherein R$_3$ and R$_4$ are each hydrogen, (R$_5$+R$_7$) and (R$_6$+R$_8$) are each —(CH$_2$)$_3$—; and R$_1$ and R$_2$ are each hydrogen or alkoxy from about 1 to about 6 carbon atoms.

23. The composition of claim 22 wherein said composition contains 0.05% to 0.5% by weight of said sensitizer and 0.01% to 0.2% of said co-sensitizer.

24. The composition of claim 21 wherein R$_{21}$, R$_{22}$, R$_{24}$, and R$_{25}$ are each hydrogen.

25. The composition of claim 24 R$_3$ and R$_4$ are each hydrogen, (R$_5$+R$_7$) and (R$_6$+R$_8$) are each —(CH$_2$)$_3$—; and R$_1$ and R$_2$ are each hydrogen or alkoxy from about 1 to about 6 carbon atoms.

26. The composition of claim 25 wherein said composition contains 0.05% to 0.5% by weight of said sensitize: and 0.01% to 0.2% of said co-sensitizer.

27. The composition of claim 1 which is present as a film.

* * * * *